(12) United States Patent
Hermann

(10) Patent No.: US 6,360,187 B1
(45) Date of Patent: Mar. 19, 2002

(54) AMBIENT ADJUSTED VOLUME CONTROL FOR IN-VEHICLES MESSAGES

(75) Inventor: Thomas J. Hermann, Troy, MI (US)

(73) Assignee: Ford Global Technologies, Inc., Dearborn, MI (US)

( * ) Notice: Subject to any disclaimer, the term of this patent is extended or adjusted under 35 U.S.C. 154(b) by 0 days.

(21) Appl. No.: 09/329,272

(22) Filed: Jun. 28, 1999

(51) Int. Cl.[7] ............................. H03F 1/26; H03G 3/20
(52) U.S. Cl. ..................... 702/191; 381/57; 381/86; 381/104; 381/107; 340/460; 340/521
(58) Field of Search .................... 702/191; 381/56, 381/57, 86, 104, 107; 340/460, 457, 692, 521

(56) References Cited

U.S. PATENT DOCUMENTS

| 4,254,303 | A | | 3/1981 | Takizawa |
| 4,314,232 | A | | 2/1982 | Tsunoda |
| 4,342,023 | A | * | 7/1982 | Tsunoda et al. ............. 340/460 |
| 4,346,364 | A | * | 8/1982 | Takagi et al. ................ 340/460 |
| 4,389,537 | A | * | 6/1983 | Tsunoda et al. .............. 381/86 |
| 4,628,526 | A | * | 12/1986 | Germer ........................ 381/57 |
| 4,771,390 | A | | 9/1988 | Dolph et al. |

* cited by examiner

Primary Examiner—Marc S. Hoff
Assistant Examiner—Hien Vo
(74) Attorney, Agent, or Firm—Mark L. Mollon

(57) ABSTRACT

The reproduction sound level of high priority messages such as navigation instructions, parking aid signals, and back-up warning signals is controlled based on the average ambient sound level in a vehicle. A sound level calibration table provides priority gain values for setting the programmable gain of a gain controller to ensure that messages are reproduced at a sound level which is relatively greater than ambient noise level by a predetermined target difference which is consistent for all levels of ambient noise. The target difference may be modified according to user preferences.

8 Claims, 3 Drawing Sheets

AMBIENT ADJUSTED VOLUME CONTROL FOR IN-VEHICLES MESSAGES

BACKGROUND OF THE INVENTION

The present invention relates, in general, to mobile control systems for providing audible messages to a driver and, more specifically, to adjusting the sound level of high priority messages from navigation systems, parking aid systems, and back-up warning systems, other high priority message sources based on ambient noise level in a vehicle.

The use in motor vehicles of navigation systems and other intelligent transportation system devices, such as parking aids and back-up warning systems, are increasing. These systems may generate audible messages which need to heard by the driver. The vehicle may also include an audio entertainment system which may be employed to play the audible messages from the navigation system, for example. However, any entertainment audio (such as AM, FM, tape, CD, or cellular phone) should have a lower priority than the high priority messages from the navigation or other ITS system. Some prior art systems allow the user to set a volume level for navigation system audible messages in advance. While this preset volume may be ideal for the conditions under which it is set, ambient noise conditions, including sound output from the audio entertainment system may be much greater during actual playing of navigation messages, making the navigation messages inaudible.

Prior art systems are known for monitoring ambient noise level and boosting the audio volume in the presence of or in proportion to ambient noise. However, in an integrated system wherein an amplifier is shared between the audio and the entertainment system and the source of high priority messages signals, the low priority sound signals are also boosted, thereby impairing the audibility of the high priority message signals.

SUMMARY OF THE INVENTION

The present invention has the advantage that the sound level at which high priority message signals are heard is controlled relative to the ambient noise level including any ambient noise produced by the low priority sound signals from the entertainment audio system and being generated using a shared amplifier.

In one aspect of the invention, a method of producing audible voice messages from a priority message system in a vehicle, wherein the vehicle includes an entertainment audio system generating low priority sound signals, comprises the following steps. An ambient noise level is measured, including any sounds resulting from the low priority sound signals. A priority sound level is determined for generating high priority message signals from the priority message system in response to the measured ambient noise level. A programmable gain is adjusted for the high priority message signals in response to the priority sound level. The high priority message signals are played at the adjusted programmable gain whereby the high priority message signals are heard at a sound level which is relatively greater than the ambient noise level by a predetermined target difference.

DETAILED DESCRIPTION OF PREFERRED EMBODIMENTS

Figure 1:
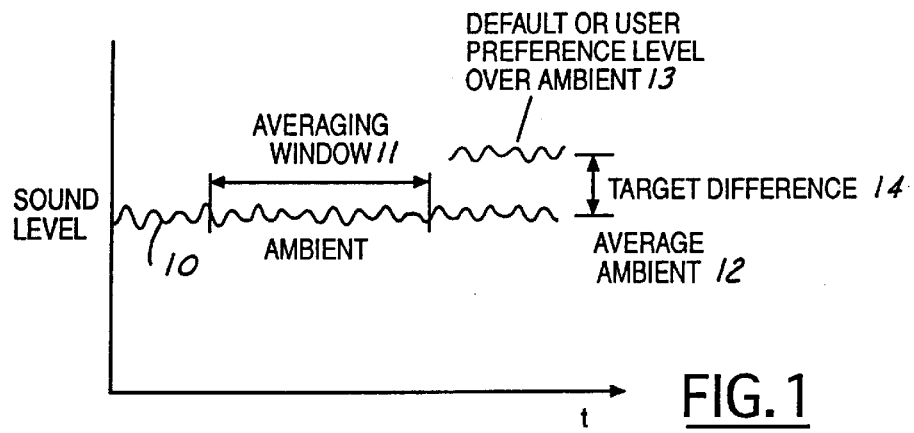
FIG. 1 is a wave plot showing the target difference between average ambient noise level and the sound level of high priority messages.

FIG. 1 shows an ambient sound level wave form which is present in a vehicle, as determined pick-up from a microphone, for example. The ambient noise level is evaluated using an averaging window 11 having a predetermined time duration which is separate from the time during which a high priority message is being played. An average ambient 12 is determined during averaging window 11. A high priority message 13 is played using a default or user preference sound level which is increased over the average ambient level by a target difference 14. The target difference is predetermined to be sufficient to ensure audibility of the high priority message without being masked by the ambient noise.

Figure 2:
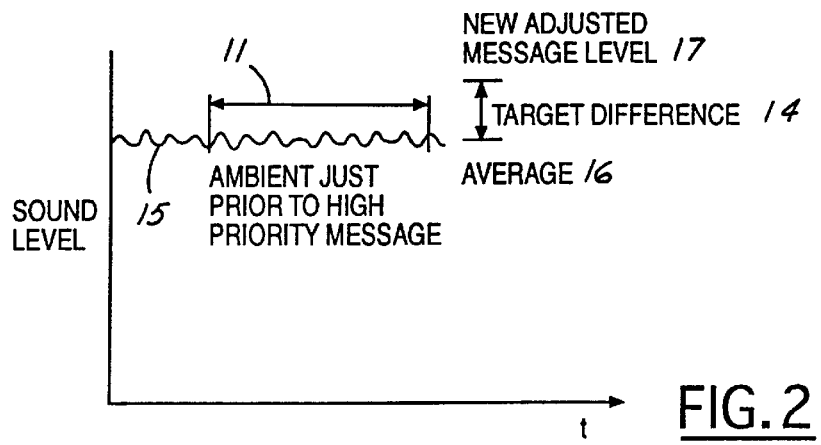
FIG. 2 is a wave plot showing a new adjusted priority message level in the presence of an increased ambient noise level.

FIG. 2 shows an ambient noise level of an ambient should wave form 15 having an average 16 over averaging window 11 which is greater than the average ambient level of FIG. 1. In playing high priority messages, a new adjusted message level 17 is utilized having the same target difference 14 over average ambient noise level 16. Thus, the high priority message signals are heard at a sound level which is relatively greater than the ambient noise level by the predetermined target difference no matter what the actual magnitude of the ambient noise level. Target difference 14 may be defined using a customization procedure operated in a vehicle by the user at just one ambient noise level. Alternatively, target difference 14 can be provided with a default design value and may optionally be provided with a variation in dependence upon the absolute magnitude the sound level.

Figure 3:
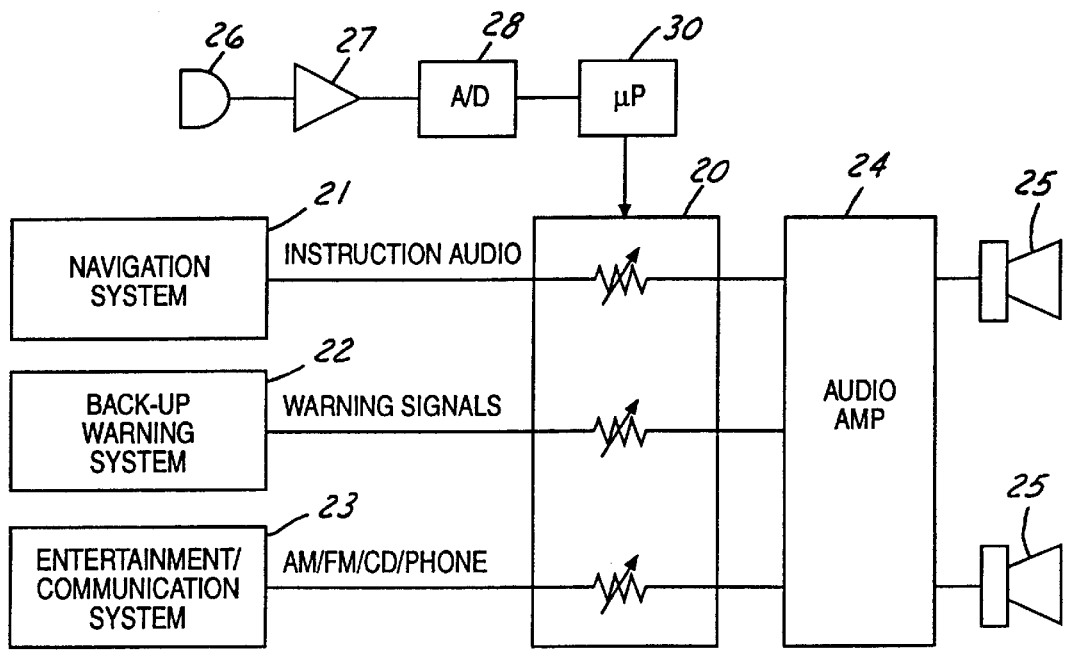
FIG. 3 is a schematic/block diagram showing the apparatus of the present invention.

A preferred apparatus of the present invention is shown in FIG. 3. A programmable gain controller 20 receives instruction audio signals from a navigation system 21, audible warning signals from a back-up warning system 22, and AM/FM/tape/CD/cellular phone audio signals from an entertainment/communication system 23. Audio signals from each source are operated upon by a programmable gain and then provided to inputs of an audio amplifier 24 for applying a fixed gain prior to reproduction by speakers 25. A microphone 26 picks up ambient noise signals which are amplified by an amplifier and converted to digital values by an analog-to-digital (A/D) 28. Digitized sound signals from A/D 28 are evaluated by a microprocessor 30 to determine average ambient noise over an averaging window. Microprocessor 30 provides control signals to programmable gain control 20 in order to select appropriate gain levels. Thus, a gain value for entertainment communication signals may be controlled by microprocessor 30 in response to a volume control knob which may be operated by the user. A programmable gain for instruction audio signals from navigation system 21 and warning signals from back-up warning system 22 (herein referred to as high priority message signals) are controlled by microprocessor 30 in response to the measured average ambient noise level using the method shown in FIG. 4. Thus, ambient noise level is measured in step 31. The programmable gain for the high priority message is set in step 32. In step 33, the microprocessor may disable other audio sources, if necessary, in order to reduce conflict with the high priority message. In step 34, the high priority message is played via the audio amplifier and speakers.

Figures 4, 5:
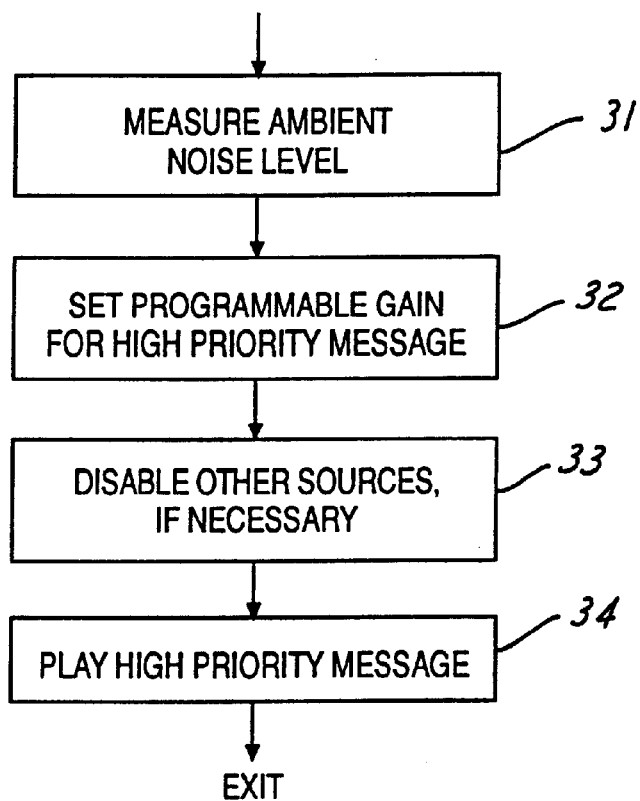
FIG. 4 is a flowchart showing a preferred embodiment of the present invention for playing high priority messages.
FIG. 5 shows a sound level calibration table of the present invention.

The programmable gain for the high priority message is determined using a sound level calibration table, as shown in FIG. 5. Average ambient level may be measured in mV as sensed by the microphone. The sound level calibration table provides a priority gain value corresponding to each one of a plurality of average ambient level ranges. Thus, when average ambient level falls in a range from zero to average ambient level $A_1$, then the gain value for producing the priority message is set at a predetermined gain $G_1$. Gain value $G_1$ is adapted for a particular vehicle (i.e., amplifier configuration, speaker placement, microphone placement, vehicle cabin size, etc.) in order to produce the high priority message at a sound level relatively greater than ambient by the predetermined target difference. Likewise, a default gain value $G_2$ is determined for an average ambient sound level in the range of $A_1$ to $A_2$, and so on. Since the sensitivity of the air to increasing sound level follows a logarithmic scale, the increase of successive default gain values likewise increase logarithmically. Sounds from the low priority sound signals of the entertainment audio system as well as background noises, road noise, and wind noise all can contribute to the average ambient sound level, the overall result of which falls into one of the table ranges. Setting the programmable gain for the high priority message signals according to the gain value from the sound level calibration table ensures that the high priority message is reproduced at a sound level relatively greater than ambient noise level and can be easily heard by vehicle occupants.

Figure 6:
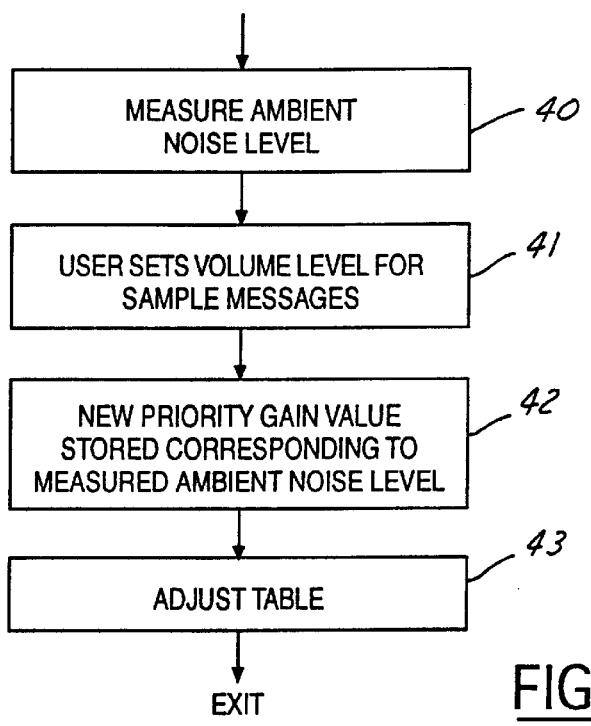
FIG. 6 is a flowchart showing user adjustment of a sound level calibration table.

In one preferred embodiment of the invention, default gain values in the sound level calibration table can be modified according to user preference. Thus, an individual user can modify the target difference by which high priority messages are heard over the ambient noise level. This may be accomplished by allowing the user to reset one predetermined gain value at one particular ambient noise level and then adjusting the remainder of the sound level calibration table to maintain the new target difference. The user would initiate a customization routine within the audio system by selecting a special procedure from a menu using the system control panel, for example. During this special routine, the average ambient noise level is measured during an averaging window as shown by step 40 in FIG. 6. After the average ambient noise level is determined, sample messages are played and the user sets a desired volume level for the sample messages in step 41. In step 42, a new priority gain value is stored in the sound level calibration table corresponding to the measured ambient noise level. The other default gain values are adjusted in step 43 to provide corresponding modification in sound level. For example, the user may manually modify the one actual gain level by increasing it by 10%. All other default gain values are then automatically increased, taking into account the logarithmic progression of the gain values. Thus, default gain values for ambient noise level ranges less than the one at which the manual modification is performed are increased by an amount less than 10% according to a logrithmic progression. Default gain values for average ambient noise level ranges greater than the one at which manual modification occurred are all increased by an amount greater than 10% according to the logrithmic progression.

In a further aspect of the present invention, the microphone used for measuring ambient noise level can further be employed to provide closed loop feedback to help ensure the audibility of high priority message signals. The controller may monitor ambient noise level during reproduction of a high priority message or may attempt to directly detect the high priority message itself using frequency analysis, for example.

Figure 7:
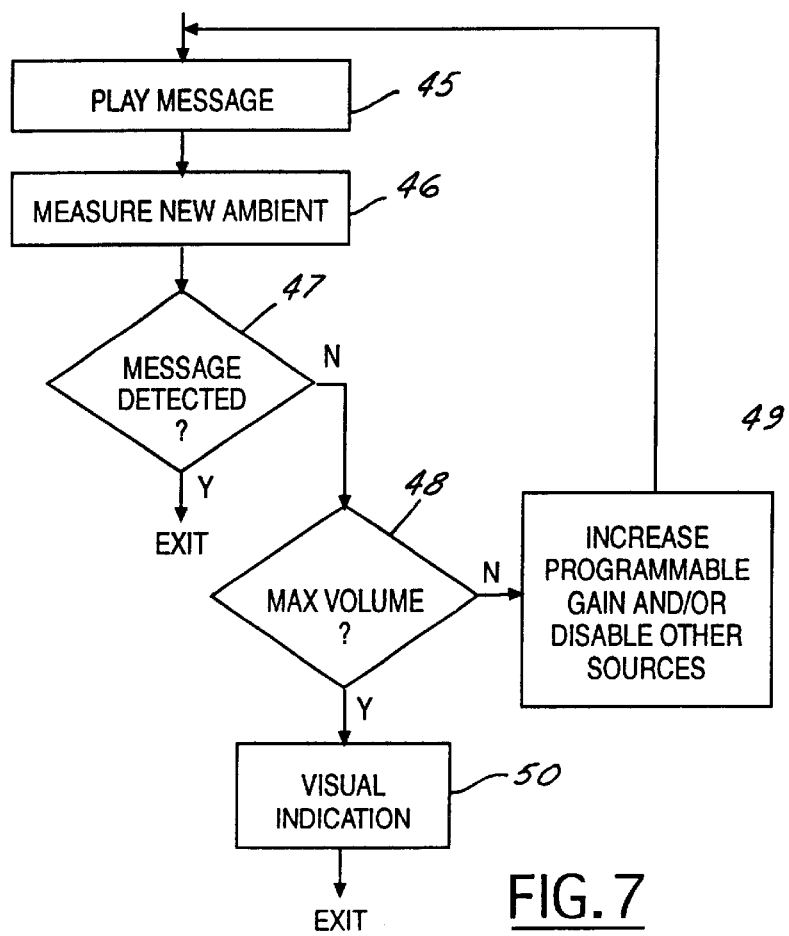
FIG. 7 is a flowchart showing the addition of closed loop feedback for ensuring successful communication of high priority messages.

One preferred embodiment of closed loop feedback is shown in FIG. 7. A high priority message is played in step 45. During the message playing, a new ambient noise level is measured in step 46. With the added energy from the high priority message being reproduced at the relatively greater sound level, the average ambient level should be increased. A check is made for the expected increase in step 47. The high priority message is detectable if the ambient noise level has increased to the expected amount. If the increase is detected, then nothing further need be done and the method is exited from step 47. If a sufficient increase in ambient noise level is not detectable in step 47, then a check is made in step 48 to determine whether the high priority message signals are already being reproduced at the maximum available gain of the amplification system. If not at maximum gain, then an increase is made to the programmable gain in step 49. In addition, other sound sources under control of the microprocessor may be disabled in order to reduce other contributions to the ambient noise level (e.g., muting the entertainment audio signals). If already at maximum volume in step 48, and if there are no other sources to be disabled, then a visual indication may be made in step 50 to alert the driver either of the actual high priority message content or just that a message was attempted. A graphics display or indicator light could be used for the visual indication.

In a further improvement to the present invention, a priority ranking may be assigned between various levels of high priority messages. For example, back-up warning signals may be given a higher priority than navigation system instruction audio messages. Messages could then be presented sequentially with the highest priority messages being reproduced first.

What is claimed is:

1. A method of producing audible voice messages from a priority message system in a vehicle, said vehicle including an entertainment audio system generating low priority sound signals, said method comprising the steps of:

measuring an ambient noise level, including any sounds resulting from said low priority sound signals;

determining a priority sound level for generating high priority message signals from said priority message system in response to said measured ambient noise level by looking up said programmable gain corresponding to said measured ambient noise level in a sound level calibration table;

adjusting a programmable gain for said high priority message signals in response to said priority sound level; and playing said high priority message signals at said adjusted programmable gain whereby said high priority message signals are heard at a sound level which is relatively greater than said ambient noise level by a predetermined target difference.

2. The method of claim 1 wherein said sound level calibration table contains default gain values adapted for said vehicle.

3. The method of claim 2 wherein said default gain values are modified according to a user preference in a method comprising the steps of:

measuring an ambient noise level;

playing sample high priority messages in response to said default gain values;

manually modifying an actual gain level for said sample messages;

adjusting said default gain value corresponding to said measured ambient noise level to said manually modified actual gain level: and adjusting other default gain values in said sound level calibration table to provide corresponding modifications in sound level.

4. A method of producing audible voice messages from a priority message system in a vehicle, said vehicle including an entertainment audio system generating low priority sound signals, said method comprising the steps of:

measuring an ambient noise level, including any sounds resulting from said low priority sound signals;

determining a priority sound level for generating high priority message signals from said priority message system in response to said measured ambient noise level, wherein said high priority message signals are comprised of navigation instructions from a vehicle navigation system;

adjusting a programmable gain for said high priority message signals in response to said priority sound level; and playing said high priority message signals at said adjusted programmable gain whereby said high priority message signals are heard at a sound level which is relatively greater than said ambient noise level by a predetermined target difference.

5. A method of producing audible voice messages from a priority message system in a vehicle, said vehicle including an entertainment audio system generating low priority sound signals, said method comprising the steps of:

measuring an ambient noise level, including any sounds resulting from said low priority sound signals;

determining a priority sound level for generating high priority message signals from said priority message system in response to said measured ambient noise level, wherein said high priority message signals and said low priority sound signals are reproduced by a shared audio amplifier;

adjusting a programmable gain for said high priority message signals in response to said priority sound level; and playing said high priority message signals at said adjusted programmable gain whereby said high priority message signals are heard at a sound level which is relatively greater than said ambient noise level by a predetermined target difference.

6. A method of producing audible voice messages from a priority message system in a vehicle, said vehicle including an entertainment audio system generating low priority sound signals, said method comprising the steps of:

measuring an ambient noise level, including any sounds resulting from said low priority sound signals;

determining a priority sound level for generating high priority message signals from said priority message system in response to said measured ambient noise level;

adjusting a programmable gain for said high priority message signals in response to said priority sound level;

playing said high priority message signals at said adjusted programmable gain whereby said high priority message signals are heard at a sound level which is relatively greater than said ambient noise level by a predetermined target difference;

re-measuring said ambient sound level while playing said high priority message signals;

determining whether said played high priority message signals were detectable; and if said played high priority message signals were not detectable, then increasing said programmable gain and replaying said high priority message signals.

7. The method of claim 6 further comprising the step of generating a visual indication of said high priority message signals if said programmable gain cannot be further increased.

8. An audible voice message system for a vehicle comprising:

a sound pickup measuring an ambient sound level within said vehicle;

an entertainment audio system generating low priority sound signals;

a priority message system generating high priority message signals;

a gain controller applying a first controllable gain to said low priority sound signals and a second controllable gain to said high priority message signals, said first controllable gain being manually adjusted by a user and said second controllable gain being adjusted in response to said measured ambient noise level, whereby said high priority message signals are heard at a sound level which is relatively greater than said ambient noise level by a predetermined target difference; and a sound level calibration table storing said second controllable gain corresponding to a plurality of measured ambient noise levels, respectively.

* * * * *